(12) United States Patent
Handa et al.

(10) Patent No.: US 7,733,018 B2
(45) Date of Patent: Jun. 8, 2010

(54) EL AND DISPLAY DEVICE HAVING SEALANT LAYER

(75) Inventors: Shinichi Handa, Shinjuku-Ku (JP); Hirofumi Nakajima, Shinjuku-Ku (JP); Kenichi Kuba, Shinjuku-Ku (JP); Hiroyuki Shirogane, Shinjuku-Ku (JP); Masaru Kobayashi, Shinjuku-Ku (JP)

(73) Assignee: Dai Nippon Printing Co., Ltd., Shinjuku-ku (JP)

( * ) Notice: Subject to any disclaimer, the term of this patent is extended or adjusted under 35 U.S.C. 154(b) by 211 days.

(21) Appl. No.: 10/527,502

(22) PCT Filed: Sep. 12, 2003

(86) PCT No.: PCT/JP03/11731

§ 371 (c)(1),
(2), (4) Date: Mar. 10, 2005

(87) PCT Pub. No.: WO2004/025997

PCT Pub. Date: Mar. 25, 2004

(65) Prior Publication Data

US 2005/0269951 A1  Dec. 8, 2005

(30) Foreign Application Priority Data

Sep. 13, 2002 (JP) .............................. 2002-267627
Sep. 13, 2002 (JP) .............................. 2002-267628

(51) Int. Cl.
*H01J 1/62* (2006.01)
(52) U.S. Cl. .................. 313/512; 313/506; 313/509
(58) Field of Classification Search ............... 313/506, 313/498–512
See application file for complete search history.

(56) References Cited

U.S. PATENT DOCUMENTS

| 2002/0130613 | A1* | 9/2002 | Inoue et al. ............... 313/506 |
| 2003/0038595 | A1* | 2/2003 | Miyake et al. ............. 313/509 |
| 2003/0124265 | A1* | 7/2003 | Bellmann et al. .......... 427/536 |
| 2003/0184219 | A1* | 10/2003 | Duggal et al. ............. 313/506 |
| 2004/0021415 | A1* | 2/2004 | Vong et al. ................ 313/509 |
| 2004/0062947 | A1* | 4/2004 | Lamansky et al. ......... 428/690 |
| 2004/0201027 | A1* | 10/2004 | Ghosh ...................... 257/99 |

FOREIGN PATENT DOCUMENTS

| JP | 08-185984 | A1 | 7/1996 |
| JP | 10-284254 | A1 | 10/1998 |

(Continued)

*Primary Examiner*—Bumsuk Won
(74) *Attorney, Agent, or Firm*—Burr & Brown

(57) ABSTRACT

Disclosed is an EL element in which the rigidity and thermal expansion of the whole EL element is homogeneous, the spacing between film substrates provided respectively on both sides of the EL element can be kept constant, and the whole EL element is flexible. The EL element comprises a first film substrate, an EL part, and a sealant layer, the EL part comprising a first electrode, an EL layer, and a second electrode and being provided on a part of a surface of the first film substrate, the sealant layer being provided to cover the EL part and to cover the EL part-free part of the surface of the first film substrate in such a manner that the sealant layer covering the EL part is contiguous with the sealant layer covering the EL part-free part of the surface of the first film substrate.

19 Claims, 2 Drawing Sheets

FOREIGN PATENT DOCUMENTS

| | | |
|---|---|---|
| JP | 10-321369 A1 | 12/1998 |
| JP | 2001-013898 A1 | 1/2001 |
| JP | 2001-015264 A1 | 1/2001 |
| JP | 2001-176670 A1 | 6/2001 |
| JP | 2001-265251 A1 | 9/2001 |
| JP | 2002-221911 | 8/2002 |
| JP | 2002-221911 A1 | 8/2002 |
| WO | 01/82389 | 11/2001 |

* cited by examiner

EL AND DISPLAY DEVICE HAVING SEALANT LAYER

BACKGROUND OF THE INVENTION

1. Field of the Invention

The present invention relates to an EL element and a display using the same.

2. Background Art

First Aspect of the Invention

EL elements (electroluminescent elements) are self-luminous elements and are quick in response and are excellent in visibility of images, as well as in image display characteristics of moving images. In particular, organic EL elements can emit light under direct current and low voltage conditions and thus are expected to find extensive applications.

The EL element generally comprises a glass substrate and a first electrode, an EL part, a second electrode, and a protective layer stacked in that order on the glass substrate. From the viewpoint of improving the function of the protective layer, however, an EL element has been developed in which, as with the glass substrate, the protective layer is formed of glass and a sealant layer is provided on the peripheral part between both the glass parts for sealing. On the other hand, in recent years, an attempt has been made to use a film substrate instead of the glass substrate. For example, Japanese Patent Laid-Open No. 15859/2002 proposes an EL element that comprises a film substrate, a first electrode, an organic EL layer, a second electrode, and a protective layer stacked on top of one another, the protective layer being formed of a layer of aluminum, silicon oxide or the like, or formed of an SiN film formed by sputtering.

From the viewpoint of improving the protective function of the protective layer, however, when the protective layer is formed of the same member as the film substrate, as in the case of the construction using the glass substrate, the formation of a sealant layer on the peripheral part of upper and lower film substrates results in the presence of a sealant layer-formed area and a sealant layer-unformed area. For this reason, mechanical properties such as rigidity and thermal expansion of the EL element are heterogeneous. Further, in this case, the distance between the upper and lower film substrates cannot be kept constant, and, thus, the planarity of the surface of the EL element cannot be sometimes maintained. Further, upon rolling of the whole EL element, the upper and lower film substrates come close to each other, and, consequently, the EL part comprising the first electrode, the EL layer, the second electrode and the like sandwiched between them is pressed and is sometimes damaged.

Second Aspect of the Invention

EL elements (electroluminescent elements) are self-luminous elements and are quick in response. Further, the thickness of the EL elements is, per se, small. Therefore, these EL elements are utilized as displays that can display letters or pictures.

For example, Japanese Patent Laid-Open Nos. 13898/2001 and 15264/2001 propose a display comprising an EL element which comprises two synthetic resin sheets for realizing further thickness reduction and flexibility improvement purposes. In these displays, however, since the EL element is sealed at its outer peripheral part, in the EL element, a sealed outer peripheral part and an unsealed part are present. This poses the following disadvantages. Mechanical properties such as rigidity and thermal expansion of the EL element are rendered uneven. Further, the distance between the two synthetic resin sheets cannot be kept constant making it impossible to maintain the planarity of the surface of the EL element. When the display is applied in a curved form, the first electrode, the EL layer, the second electrode and the like constituting the EL element sandwiched between the two synthetic resin sheets are pressed and are damaged.

Further, the display proposed in Japanese Patent Laid-Open No. 13898/2001 is in the form of a resin film formed by properly combining posters, letters, and pictures and rendering the necessary part transparent or semi-transparent. The display proposed in Japanese Patent Laid-Open No. 15264/2001 comprises a substrate and a luminescent pattern formed by forming a light shielding part by printing or the like to pattern the luminescent part on the surface of the substrate. Due to the above constructions, in these displays, letters or pictures which can be displayed are restricted making it difficult to realize displays with a free design.

SUMMARY OF THE INVENTION

First Aspect of the Invention

The present inventor has now found that the formation of a sealant layer to cover an EL part provided on a part of a surface of a first film substrate and to cover the EL part-free part of the surface of the first film substrate in such a manner that the sealant layer covering the EL part is contiguous with the sealant layer covering the EL part-free part of the surface of the first film substrate can improve mechanical properties such as rigidity and thermal expansion of the EL element and the planarity of the surface of the EL element and, further, can prevent damage to a first electrode, an EL layer, a second electrode and the like. The present invention has been made based on such finding.

Thus, according to a first aspect of the present invention, there is provided an EL element comprising a first film substrate, an EL part, and a sealant layer.

The EL part includes a first electrode, an EL layer, and a second electrode and is provided on a part of a surface of the first film substrate.

The sealant layer is provided to cover said EL part and to cover the EL part-free part of the surface of the first film substrate in such a manner that the sealant layer covering the EL part is contiguous with the sealant layer covering the EL part-free part of the surface of the first film substrate.

In the EL element according to the first aspect of the present invention, the sealant layer is formed on the whole area including the peripheral part for sealing. Therefore, the rigidity and thermal expansion of the whole EL element are uniform, the distance between the film substrates on both sides can be kept constant, and the whole EL element is flexible.

Second Aspect of the Invention

The present inventor has now found that a combination of the EL element according to the first aspect of the present invention with a light transparent pattern layer can provide a display that has improved mechanical strength and surface smoothness, is flexible in its entire part, and can realize a free design independently of the form of letters or pictures. The present invention has been made based on such finding.

According to a second aspect of the present invention, there is provided a display using an EL element. The EL element includes a first film substrate, an EL part, and a sealant layer. The EL part includes a first electrode, an EL layer, and a second electrode is provided on a part of a surface of the first film substrate. The sealant layer is provided to cover said EL part and to cover the EL part-free part of the surface of the first film substrate in such a manner that the sealant layer covering the EL part is contiguous with the sealant layer covering the EL part-free part of the surface of the first film substrate. The EL element is located on such a side that, upon energization of any one of or both the first film substrate side and the sealant layer side, fluorescent emission is viewable, a light transparent pattern layer being formed on the fluorescent emission-viewable side.

In the display according to the second aspect of the present invention, the sealant layer is formed on the whole area including the peripheral part of the EL element part. Therefore, the rigidity and thermal expansion of the whole EL element part are uniform, the distance between the film substrates on both sides of the EL element part can be kept constant, and the whole display is flexible.

DETAILED DESCRIPTION OF THE INVENTION

Embodiments of Invention

Figure 1:
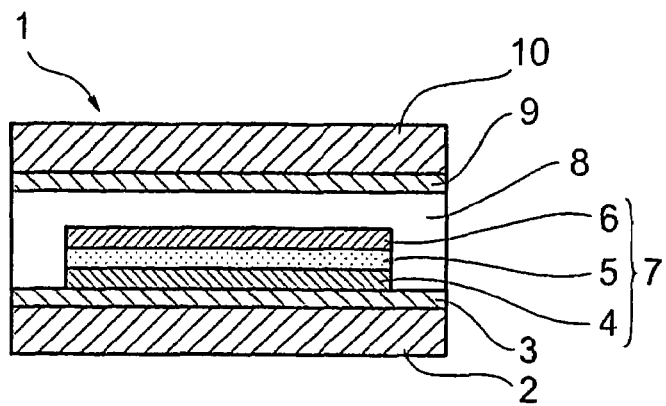
FIG. 1 is a cross-sectional view of an EL element.

First Aspect of Invention
A1. EL Element
An EL element in a first aspect of the present invention will be described with reference to FIG. 1. FIG. 1 is a cross-sectional view showing a preferred embodiment of the EL element according to the present invention. As shown in FIG. 1, the EL element according to the present invention comprises a first film substrate 2, a barrier layer 3, a first electrode 4, an EL part 7 comprising a luminescent layer 5 and a second electrode 6, a sealant layer 8, a barrier layer 9, and a second film substrate 10. The EL part 7 is provided on the barrier layer 3 while leaving a part of the barrier layer 3 as it is without providing the EL part 7 thereon, that is, the EL part 7 is provided on a part of the barrier layer 3. A sealant layer 8 is provided as a continuous layer covering both the second electrode 6 and the barrier layer 3 in its part where the EL part 7 is not provided so that the upper surface of the sealant layer 8 is flat. Further, a barrier layer 9 and a second film substrate 10 are provided on the upper surface of the sealant layer 8.

FIG. 1 is a diagram showing a preferred embodiment of the present invention. Accordingly, the present invention embraces an EL element in which both or one of the barrier layers 3 and 9 is omitted, and an EL element in which the second film substrate 10 is omitted.

In the present invention, the EL part 7 is provided on a part of the first film substrate 2 or the barrier layer 3. Alternatively, the EL part 7 may be provided on the whole surface of the first film substrate 2 or the barrier layer 3. In this case, in order to ensure airtightness of the EL layer, the EL part 7 should be satisfactorily sealed with the sealant layer 8.

Film Substrate
The film substrate is preferably a flexible substrate, and examples thereof include polymeric materials, preferably resin films. In the present invention, thin sheet glass (or sheet-like thin-film glass) having a thickness of about 200 μm or less also falls into the concept of the flexible substrate. In the present invention, an EL element comprising a first film substrate alone as the film substrate can be provided. Preferably, however, an EL element comprising a first film substrate and a second film substrate can be provided. In this case, the first film substrate and the second film substrate may be the same or different.

The resin constituting the resin film is not particularly limited. However, resins having a relatively high level of solvent resistance and heat resistance are preferred. More preferred are resins having gas barrier properties which can shield water vapor or gas such as oxygen. Specific examples of resins constituting the resin film include fluororesins, polyethylenes, polypropylenes, polyvinyl chlorides, polyvinyl fluorides, polystyrenes, ABS resins, polyamides, polyacetals, polyesters, polycarbonates, modified polyphenylene ethers, polysulfones, polyarylates, polyetherimides, polyamideimides, polyimides, polyphenylene sulfides, liquid crystalline polyesters, polyethylene terephthalates, polybutylene terephthalates, polyethylene naphthalates, polyoxymethylenes, polyethersulfones, polyetherether ketones, polyacrylates, acrylonitrile-styrene resins, phenolic resins, urea resins, melamine resins, unsaturated polyester resins, epoxy resins, polyurethanes, silicone resins, or amorphous polyolefins. Copolymers formed by using two or more monomers as starting materials of these resins are also preferred.

The thickness of the first film substrate and the thickness of the second film substrate are preferably 50 to 300 μm, and the thickness of the whole EL element is preferably 100 to 700 μm.

At least one of the first film substrate and the second film substrate is preferably transparent. The film substrate is preferably combined with a transparent electrode in the EL part which will be described later so that the display part in the EL element can easily be viewed by an observer. In a preferred embodiment of the present invention, an EL element in which the film substrate and the electrode are entirely transparent to render the whole element transparent is preferred.

Sealant Layer
The sealant layer functions to hermetically seal the EL part and to shield an organic luminescent materials within the EL part from gas such as oxygen or water vapor (in particular). In the present invention, the sealant layer may be continuously stacked on the EL part and on the first film substrate (on the barrier layer 3 if the barrier layer 3 is provided) without providing the second film substrate. In a preferred embodiment of the present invention, the EL part is held between the first film substrate and the second film substrate. Also in this case, the sealant layer is provided so as to seal the interior of both the substrates.

Accordingly, the sealant constituting the sealant layer should be selected by taking into consideration the adhesion to the film substrate, the EL part, particularly the second electrode. Specific examples of preferred sealants constituting the sealant layer include those composed mainly of thermoplastic acrylic resins, heat curable epoxy resins (two component curable), rubber modified epoxy resins, or two component curable urethane resins. In all the above cases, an isocyanate compound may also be added.

Curable sealants are utilizable, and specific examples thereof include heat curable sealants, acrylate compound-containing ionizing radiation-curable (ultraviolet (UV) curable or visible curable) sealants. Specific examples thereof include UV curable acrylic resins (radical curable acrylic), UV curable epoxy (cationic curable epoxy), and two component curable epoxy, or visible curable acrylic adhesives.

The sealant is prepared by providing a necessary sealant material depending upon the contemplated sealant, mixing a main agent and a curing agent at a predetermined mixing ratio in the case of a two component curing agent, and, if necessary, adding a solvent or a diluent to regulate a viscosity suitable for coating. In the present invention, since the sealant layer covers a major part of the EL element, from the viewpoints of eliminating foreign materials and air bubbles and improving the appearance and display properties of the EL element, preferably, before use, the sealant is filtered to remove foreign materials, or a centrifugal deaerator is used for deaeration.

The sealant layer may be formed by a proper method. For example, the sealant layer may be formed by providing an instrument, which is of a pressure type and can deliver a given volume, such as an injector or a dispenser, then delivering the sealant in a linear or strip form onto the area to be applied, bringing a doctor such as a rod or blade doctor into contact with the delivered linear or strip sealant, and moving the doctor while maintaining the distance between the doctor and the sealant-applying area at a constant value to extend the sealant while regulating the coverage, thereby applying the sealant in a predetermined planar form. Additional methods usable herein include a method in which a slit and an area to be applied are moved relatively while extruding the sealant through a slit, a method in which an applicator for the formation of a thin layer in a thin layer chromatography is used, and a silk screen printing.

Preferably, a sealing plate is gently laminated on the EL element with a sealant applied thereon so as not to include air bubbles and, if necessary, the assembly is pressed. Thereafter, depending upon the type of the sealant used, means is adopted such as a method in which the sealant is cured by heating, or a method in which the sealant is cured through crosslinking by baking or ultraviolet irradiation.

The thickness of the sealant layer is preferably 20 to 1000 μm, more preferably 100 to 500 μm, in a part where the EL part is interposed. In the part where the EL part is absent, the thickness of the sealant layer is increased by the thickness of the EL part. In fact, however, since the thickness of the EL part is as small as about 0.1 to 2.5 μm, the thickness of the whole sealant layer is considered as constant.

EL Part

1) Electrode

In the present invention, a pair of electrodes are used. One of the electrodes is an anode, and the other is a cathode. For easy understanding of the EL element according to the present invention, the first electrode is used as the anode, and the second electrode is used as the cathode.

Specific examples of materials for the first electrode (anode) include indium tin oxide (ITO), indium oxide, gold, or polyaniline and mixtures thereof. Specific examples of materials for the second electrode (cathode) include magnesium alloys (for example, MgAg), aluminum alloys (for example, AlLi, AlCa, or AlMg), or metallic calcium and mixtures thereof.

Both the electrodes can be formed by subjecting the above material to vapor deposition, sputtering or the like to form a layer on the whole area of the underlying layer, or by subjecting the layer formed on the whole area to pattern etching with a photosensitive resist to form a predetermined electrode pattern.

In order that the whole EL element according to the present invention is transparent, both the electrodes should be formed of a transparent material. The anode poses no problem because the above material is transparent. In the case of the cathode, however, since some materials are not transparent, transparency should be imparted by the thickness. In this case, the thickness is preferably, for example, not more than 500 nm, more preferably not more than 300 nm.

In a preferred embodiment of the present invention, the EL element is constructed so that the second electrode is a metallic opaque electrode and viewing is conducted from the first film substrate side, or the EL element is constructed so that the layers constituting the EL element are made transparent and, in a nondisplayed state, the whole EL element is transparent.

2) EL Layer

The material constituting the EL layer (organic luminous material layer) may be any conventional organic luminous material (organic fluorescent material), and examples thereof include pyrene, anthracene, naphthacene, phenanthrene, coronene, chrysene, fluorene, perylene, perinone, diphenyl butadiene, coumarin, styryl, pyrazine, aminoquinoline, imine, diphenyl ethylene, merocyanine, quinacridone, or rubrene and derivatives thereof.

3) Optional Layer

The EL part may comprise, in addition to the EL layer, a hole transport layer, an electron transport layer, a hole transport layer which functions also as an organic luminous layer, and an organic luminous layer which functions also as an electron transport layer.

Specific examples of materials constituting the hole transport layer include phthalocyanine, naphthalocyanine, porphyrin, oxadiazole, triphenyl amine, triazole, imidazole, imidazolone, pyrazoline, tetrahydroimidazole, hydrazone, stilbene, or butadiene or derivatives thereof. Further, for example, poly(3,4)ethylenedioxythiophene (PEDOT)/polystyrene sulfonate (PSS) [a product of Bayer, tradename: Baytron P Al 4083, aqueous solution] which is commercially available as a composition for hole injection buffer formation may also be used.

Specific examples of materials for constituting the electron transport layer include anthraquinodimethane, fluorenylidenemethane, tetracyanoethylene, fluorenone, diphenoquinone oxadiazole, anthrone, thiopyran dioxide, diphenoquinone, benzoquinone, malononitrile, dinitrobenzene, nitroanthraquinone, maleic anhydride, or perylene tetracarboxylic acid or derivatives thereof.

The EL layer or the above optional layer may be formed by vapor depositing or sputtering materials for constituting these layers, or by dissolving (preferably) or dispersing these materials in a proper solvent to prepare a coating liquid and coating or printing (ink jet printing) the coating liquid or dispensing the coating liquid.

Barrier Layer

In a preferred embodiment according to the present invention, the EL element comprises a barrier layer having gas barrier properties or/and water vapor barrier properties provided on the EL part side of the first film substrate and/or second film substrate. The provision of the barrier layer can suppress a deterioration in fluorescing properties of an organic fluorescent substance constituting the EL layer in the EL part by gas such as oxygen or water vapor (in particular).

Preferably, the barrier layer is formed by deposition of a resin having barrier properties, preferably by vapor deposition of an inorganic oxide or by thin film formation by sputtering. The barrier layer may have a single-layer structure of a thin film of an inorganic oxide or a multilayer structure of two or more thin films of an identical or different inorganic oxides.

Further, in the formation of the barrier layer, as shown in FIG. 1, a proper synthetic resin layer may be stacked between the barrier layer 3 and the first film substrate 2, or between the barrier layer 9 and the second film substrate 10, or on the barrier layer 3 in its side remote from the first film substrate 2, or on the barrier layer 9 in its side remote from the second film substrate 10. Further, when the barrier layer has a multilayer structure of two or more thin layers of an inorganic oxide(s), a proper synthetic resin layer may be provided between the thin inorganic oxide films.

In a preferred embodiment according to the present invention, when the barrier layer and the synthetic resin layer are formed on both sides of each of the film substrates, these layers are provided symmetrically. In the EL element in which the individual layers have been formed in this way, curling of the EL element upon exposure to a temperature change can be effectively prevented.

Specific examples of inorganic oxides include silicon oxide, aluminum oxide, titanium oxide, yttrium oxide, germanium oxide, zinc oxide, magnesium oxide, calcium oxide, boron oxide, strontium oxide, barium oxide, lead oxide, zirconium oxide, sodium oxide, lithium oxide, potassium oxide, or mixtures thereof. Preferred are silicon oxide, aluminum oxide, and titanium oxide. Further, silicon nitride may also be used.

The thickness of the barrier layer is about 0.01 to 0.5 μm. When the EL element is transparent, preferably, the thickness of the barrier layer at least on its side required to be transparent is not excessively large from the viewpoint of ensuring the transparency of the barrier layer.

A2. Applications of EL Element

The EL element according to the present invention is thin as a whole and is lightweight and has excellent flexibility. Therefore, the EL element according to the present invention can take forms which are impossible in EL elements using plate substrates such as glass substrates. For example, rolling, or fixing along a side face of a cylindrical surface is possible. Further, in the EL element according to the present invention, since a film substrate is used, a method may be adopted in which a film substrate in a roll form is supplied, is processed, and is again wound in a roll form. Therefore, various processings can be continuously carried out.

The EL element according to the present invention may be constructed so that uniform luminescence is simply provided from the whole area. Alternatively, a construction may also be adopted in which the first electrode or/and the second electrode in the EL element according to the present invention is provided in a pattern form and the EL layer is constructed so that fine zones are arranged respectively, for example, for red light emission, green light emission, and blue light emission. Thus, ordinary color display can be realized.

The EL element according to the present invention can be used in ordinary color display, as well as in the following application. This application will be described with reference to FIGS. 2 and 3.

Figure 2:
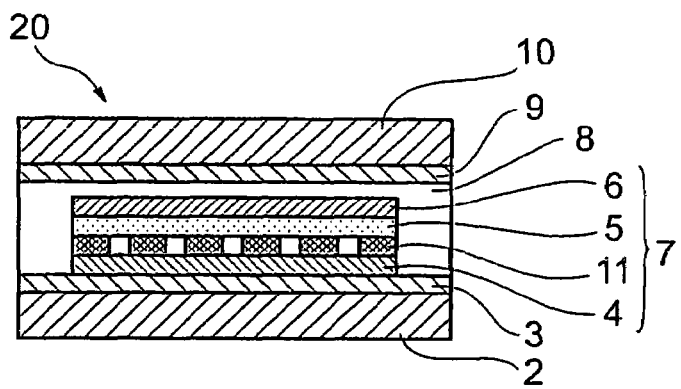
FIG. 2 is a cross-sectional view of an EL element with an insulating layer pattern interposed.

The construction of an EL element 20 shown in FIG. 2 is the same as the construction of the EL element 1 shown in FIG. 1, except that an insulating layer pattern, particularly an insulating layer pattern 11 which is a layer formed of an insulating material and has through-openings, is interposed between the first electrode 4 and the EL layer 5 in the EL part 7. Fluorescent emission takes place at positions corresponding to the openings in the insulating layer pattern 11, while fluorescent emission does not take place at the positions other than the openings. Therefore, in this case, luminescence can be provided in the opening pattern. In the present invention, alternatively, the insulating layer pattern 11 may be interposed between the EL layer 5 and the second electrode 6. In the EL element 20, during nonenergization, the color of the EL element 20 is visible. Therefore, when the second electrode is formed of a metallic opaque layer, the color of the opaque layer is viewed. On the other hand, the whole second electrode is transparent, the color is seen through the EL element 20. Accordingly, a method may be adopted in which the above EL element 20 is superimposed on a print. In this case, during nonenergization of the EL element 20, the print is visible. On the other hand, during energization, a fluorescent emission pattern corresponding to the insulating layer pattern 11 in the EL element 20 is visible, and, in the parts other than the fluorescent emission pattern, the print can be viewed. In this method, the fluorescent emission may be constructed so as to take place even on the whole area. Alternatively, the fluorescent emission may be constructed for color display applications.

Any material having insulating properties can be used as the material for constituting the insulating layer pattern. Such materials usable herein include conventional resins and inorganic materials such as SiO, $SiO_2$, or SiON. Preferred are ionizing radiation curable compositions that can be patterned and are curable upon exposure to an ionizing radiation such as an electron beam or ultraviolet light, specifically commercially available negative-working or positive-working photoresists. Specific examples of positive-working photoresists include compositions composed mainly of a photodecomposition solubilization-type quinone diazide photosensitive resin and the like. Specific examples of negative-working photoresists include compositions comprising photodecomposition crosslinking-type azide photosensitive resins, photodecomposition insolubilization-type diazo photosensitive resins, photodimerization-type cinnamate photosensitive resins, photopolymerization-type acrylate resins, cationic polymerization-type resins or the like.

Photosensitive resin compositions, comprising, in addition to these photosensitive resins, optional additives such as photopolymerization initiators and sensitizing dyes may also be used as the photoresist.

The insulating layer pattern may be interposed by patterning, for example, according to a coating method or a printing method such as ink jet printing or gravure printing or offset printing, using a composition containing the above insulating material dissolved or dispersed therein.

Alternatively, a method may also be adopted in which an insulating layer pattern is once formed on a separate substrate by the above coating or printing method and is then transferred onto a desired substrate by heat or pressure. Further, a method may also be adopted in which an insulating layer having a desired pattern is formed with a mask by vapor deposition or sputtering mainly using an inorganic material. When a photoresist is utilized, it may be formed by coating according to a spin coating method and then conducting pattern exposure and development.

The thickness of the insulating layer pattern is about 0.1 to 20 μm.

Figure 3:
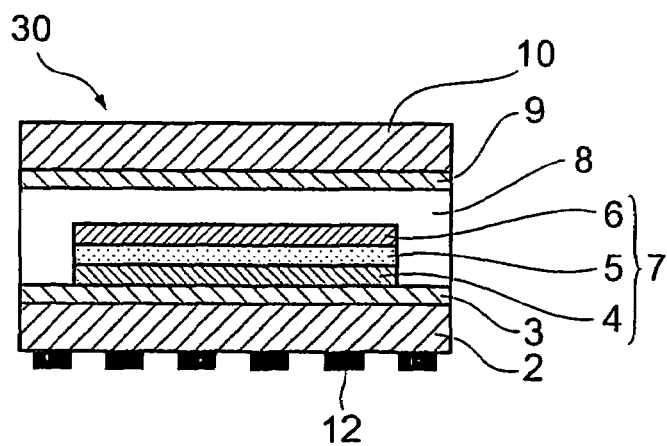
FIG. 3 is a cross-sectional view of a display including an EL element.

FIG. 3 is a cross-sectional view of a display 30 using the EL element 1 according to the present invention. In the display 30, a pattern 12 comprising a light shielding layer area and a light shielding layer-free area is provided on the lower surface side, that is, the viewer side, of the first film substrate 2 in the EL element 1 shown in FIG. 1. Upon energization of the display 30, the EL element 1 can be seen as if the EL element has emitted a pattern of fluorescence corresponding to the light shielding layer-free area in the pattern 12. The pattern 12 may not necessarily be a light shielding pattern and may be such that an area, for example, a colored transparent area, the light transmission of which is lower than a colorless transparent area, is provided. According to this construction, a decorative illumination signboard, which is much thinner than the conventional decorative illumination signboard, can be provided. Therefore, the decorative illumination signboard according to the present invention can be applied to even places where the installation of the conventional decorative illumination signboard is difficult due to its large thickness. Also in this case, the fluorescent emission may be constructed so as to take place uniformly on the whole area. Alternatively, the fluorescent emission may be constructed for color display applications.

The details of the pattern layer may be the same as those explained in connection with the second aspect of the present invention.

Second Aspect of the Invention

Figure 4:
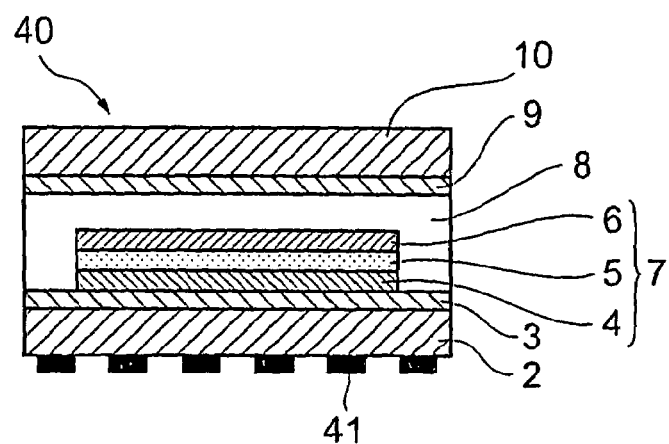
FIG. 4 is a cross-sectional view of a display including an EL element.

The display according to the second aspect of the present invention will be described with reference to FIG. 4. FIG. 4 is a cross-sectional view showing a preferred embodiment of the display according to the present invention. As shown in FIG. 4, in a display 40 according to the present invention, various layers are provided on a first film substrate 2 with a barrier layer 3 provided on its upper surface. A light transparent pattern layer 41 is provided on the underside of the first film substrate 2. The display according to the second aspect of the present invention is the same as the EL element (FIG. 1) in the first aspect of the present invention, except that the light transparent pattern layer is provided on the underside of the EL element. That is, the construction of the EL element in the display according to the second aspect of the present invention is the same as that shown in FIG. 2.

B1. Display

EL Element

In the display according to the present invention, the EL element according to the first aspect of the present invention is utilized. Therefore, the construction of the EL element may be the same as that described above in connection with the first aspect of the present invention.

Light Transparent Pattern Layer

In principle, the light transparent pattern layer (hereinafter often referred to as "pattern layer") may be any pattern layer so far as light emitted from the EL element can be transmitted through the pattern layer. For example, the pattern layer may be one in which a non-light shielding part (a light transparent part) surrounded by a light shielding part is provided as a pattern. This pattern layer may be formed by solid printing of the light shielding part. When the pattern layer has this pattern comprising a non-light shielding part surrounded by the light shielding part, upon luminescence of the EL element, a pattern of luminescence in a form conforming to the pattern of the non-light shielding part is visible. Alternatively, the construction of the pattern layer may be opposite to the above construction. Specifically, the pattern layer may have a pattern comprising a light shielding part surrounded by a non-light shielding part (a light transparent part).

The pattern layer can be efficiently formed by printing. The pattern layer may be formed on each of sheets separated from each other by cutting or on a continuous sheet.

The pattern formed by printing is not limited to the pattern formed by solid printing and may be one formed by dot printing. The proportion of dots (dot area percent) is generally variable in the range of a few % (minimum %) to 100%. In the case of a dot pattern formed by printing, except for the part with the dot area percent 100%, gaps are present among the dots. Therefore, in a pattern formed by printing using dots, light can be transmitted through the pattern even when the individual dots per se are not transparent to light, and, thus, in the case of a pattern layer having this pattern, a pattern of luminescence in which the quantity of transmitted light varies depending upon the size of gaps among the dots is visible.

In general printing, in many cases, the pattern is formed by the so-called "positive pattern" in which individual dots have been colored. Conversely, a pattern layer may be constructed by the so-called "negative pattern" of a dot pattern in which individual dots are not colored while the non-dot part is colored.

The pattern comprising a non-light shielding part surrounded by a light shielding part and the pattern comprising a light shielding part surrounded by a non-light shielding pattern have been described above. Further, a dot pattern in which, in the above patterns, the non-light shielding part is formed of dots (except for high dot area percent (for example, not less than 80%) or 100% dot area percent) may be adopted. The dot pattern may be a positive pattern or a negative pattern. Furthermore, in the pattern comprising a non-light shielding part surrounded by a light shielding part and the pattern comprising a light shielding part surrounded by a non-light shielding part, the light shielding part may be formed of dots with a relatively low dot area percent (for example, about 0 (zero) to 50%) although, strictly speaking, the part constituted by these dots is somewhat different from the light shielding part.

In the present invention, sites on which ink has been deposited by printing may seem to be nonpermeable to light. However, a person having ordinary skill in the art could of course understand that, when a transparent ink prepared by using a dye or pigment particles having a diameter much smaller than the wavelength is used for printing (even in the case of solid printing) of a pattern, that part is transparent (colored and transparent).

Therefore, any of the pattern comprising a light shielding part and a non-light shielding part, the pattern formed of dots, and the pattern formed using a transparent ink can constitute the pattern layer of the display according to the present invention. The pattern layer may be any light transparent pattern layer in which the light transparent part is in a pattern form.

The pattern layer may be formed by conventional printing methods, ink jet recording methods, electrophotographic methods, or transfer methods. Transfer methods include, for example, a method in which a print is provided on a separable substrate in its separable side and is then transferred onto a film substrate. Therefore, in the present invention, ink jet recording methods, electrophotographic methods, transfer methods and methods similar thereto are included in the concept of "printing." When the display according to the present invention does not have one of the film substrates, the sealant layer constitutes a printing surface.

Figure 5:
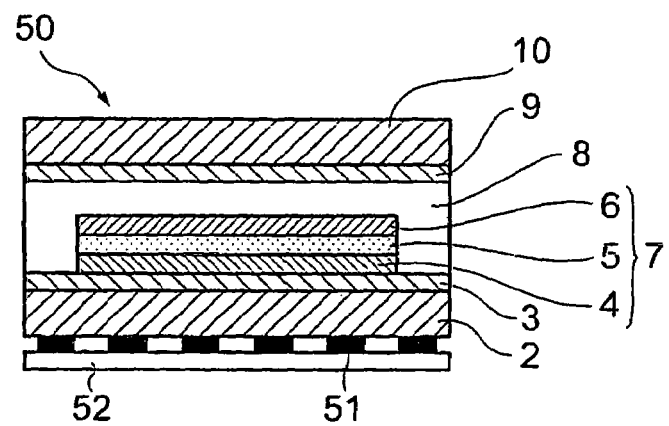
FIG. 5 is a cross-sectional view of a display provided with a transparent substrate film.

As shown in FIG. 5, the pattern layer may be formed between the first film substrate 2 and the film substrate 52 different from the first film substrate 2. The first transparent film substrate 2 and the film substrate 52 on which the pattern layer 51 has been formed can be stacked on top of each other, for example, by heat fusion or by lamination through an adhesive. When the pattern layer is formed on the film substrate 52, damage to the EL element at the time of pattern layer formation can be effectively prevented without particular consideration of pattern layer formation conditions. The film substrate may be any substrate so far as it is transparent. For example, the film substrate may be that used as the material for the first film substrate.

Further, the pattern layer may be formed of a light shielding sheet having an opening part in a pattern form, a dot form or the like. In this method, for example, the step of punching or laser beam cutting-out is necessary for the formation of the opening part. As compared with the pattern layer formed by the printing method, the pattern layer formed by this method is advantageous in that the durability is higher, the distinction between the light shielding part and the non-light shielding part is clearer, and the pattern of luminescence is also clearer.

B2. Applications of Display

By virtue of the above construction, the display according to the present invention is thin as a whole and is lightweight and has excellent flexibility. Therefore, the display according to the present invention can take forms which are impossible in displays using plate substrates such as glass substrates. For example, rolling of the display, or fixing of the display along a side face of a cylindrical surface is possible. Further, in the display according to the present invention, since a flexible film substrate is used, unlike the prior art technique in which a display is prepared for each substrate, a method may be adopted in which a film substrate in a roll form is supplied, is processed, and is again wound in a roll form. Therefore, subsequent various processings can be continuously carried out.

Figure 6:
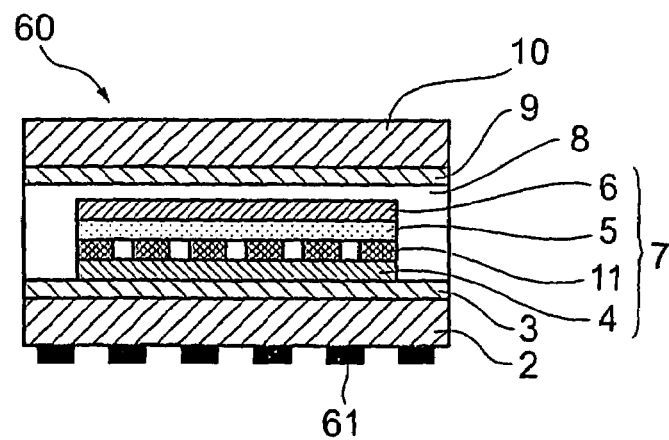
FIG. 6 is a cross-sectional view of a display with an insulating layer pattern interposed.

One preferred embodiment of the display according to the present invention will be described with reference to FIG. 6. As shown in FIG. 6, an insulating layer pattern 11 comprising a layer formed of an insulating material having an opening part of through-holes is interposed between a first electrode 4 and an EL layer 5 in an EL part. According to this construction, fluorescent emission takes place at positions corresponding to the opening part in the insulating pattern 11, while fluorescent emission does not take place at positions other than the opening part. Therefore, luminescence in the form of a pattern corresponding to the opening part can be formed. That is, the combined use of the pattern of the pattern layer and the pattern of the insulating layer pattern is possible. The insulating layer pattern 11 may be interposed between the EL layer 5 and the second electrode 6. In the display 60, during nonenergization, the color of the EL element is seen. Therefore, when the second electrode 6 is formed of a metallic opaque layer, the color of the opaque layer is seen. On the other hand, when the whole is transparent, viewing through the EL element is possible. In this case, fluorescent emission may be constructed so as to take place even on the whole area. Alternatively, the fluorescent emission may be constructed for color display applications. This may be the same as that described above in connection with the first aspect of the present invention. Details of the insulating layer pattern may be the same as those described above in connection with the first aspect of the present invention.

The invention claimed is:

1. An EL element comprising a first film substrate, an EL part, and a sealant layer,
   said EL part comprising a first electrode, an insulating layer pattern, an EL layer, and a second electrode, wherein said insulating layer pattern is between the first electrode and the EL layer or between the EL layer and the second electrode and separates the entirety of the EL layer from the first or second electrode, said EL part being provided on a part of a surface of the first film substrate,
   said sealant layer being provided to cover said EL part and to cover an EL part-free part of the surface of the first film substrate in such a manner that the sealant layer covering the EL part is contiguous with the sealant layer covering the EL part-free part of the surface of the first film substrate.

2. The EL element according to claim 1, wherein the thickness of the first film substrate is 50 to 300 µm and the thickness of the whole EL element is 100 to 700 µm.

3. The EL element according to claim 1, wherein any one of the first film substrate and the first electrode is transparent.

4. The EL element according to claim 1, wherein the whole EL element is transparent.

5. The EL element according to claim 1, wherein barrier properties and/or water vapor barrier properties are provided between the first film substrate and the EL part.

6. An EL element comprising a first film substrate, an EL part, a sealant layer, and a second film substrate,
   said EL part comprising a first electrode, an insulating layer pattern, an EL layer, and a second electrode, wherein said insulating layer pattern is between the first electrode and the EL layer or between the EL layer and the second electrode and separates the entirety of the EL layer from the first or second electrode, said EL part being provided on a part of a surface of the first film substrate,
   said sealant layer being provided to cover said EL part and to cover an EL part-free part of the surface of the first film substrate in such a manner that the sealant layer covering the EL part is contiguous with the sealant layer covering the EL part-free part of the surface of the first film substrate,
   a second film substrate being provided on the sealant layer.

7. The EL element according to claim 6, wherein the thickness of the first film substrate and the thickness of the second film substrate each are 50 to 300 µm and the thickness of the whole EL element is 100 to 700 µm.

8. The EL element according to claim 6, wherein any one of the first film substrate and the first electrode or any one of the second electrode and the second film substrate is transparent.

9. The EL element according to claim 6, wherein a barrier layer having gas barrier properties and/or water vapor barrier properties is provided on any one of or both a surface of the first film substrate and a surface of the second film substrate which face each other.

10. A display using an EL element,
    said EL element comprising a first film substrate, an EL part, and a sealant layer,
    said EL part comprising a first electrode, an insulating layer pattern, an EL layer, and a second electrode, wherein said insulating layer pattern is between the first electrode and the EL layer or between the EL layer and the second electrode and separates the entirety of the EL layer from the first or second electrode, said EL part being provided on a part of a surface of the first film substrate,
    said sealant layer being provided to cover said EL part and to cover an EL part-free part of the surface of the first film substrate in such a manner that the sealant layer covering the EL part is contiguous with the sealant layer covering the EL part-free part of the surface of the first film substrate,
    said EL element being located on such a side that, upon energization of any one of or both the first film substrate side and the sealant layer side, fluorescent emission is viewable, a light transparent pattern layer being formed on the fluorescent emission-viewable side.

11. The display according to claim 10, wherein said light transparent pattern layer comprises openings using a light shielding sheet as a substrate.

12. The display according to claim 10, wherein said light transparent pattern layer is a design layer formed by printing.

13. The display according to claim 12, wherein said design layer is formed of a transparent film substrate different from the film substrate constituting the EL element.

14. The display according to claim 10, wherein a barrier layer having at least one of gas barrier properties and water vapor barrier properties is provided between the first film substrate and the EL part.

15. A display using an EL element,
   said EL element comprising a first film substrate, an EL part, a sealant layer, and a second film substrate,
   said EL part comprising a first electrode, an insulating layer pattern, an EL layer, and a second electrode, wherein said insulating pattern is between the first electrode and the EL layer or between the EL layer and the second electrode and separates the entirety of the EL layer from the first or second electrode, said EL part being provided on a part of a surface of the first film substrate,
   said sealant layer being provided to cover said EL part and to cover an EL part-free part of the surface of the first film substrate in such a manner that the sealant layer covering the EL part is contiguous with the sealant layer covering the EL part-free part of the surface of the first film substrate,
   a second film substrate being provided on said sealant layer,
   said EL element being located on such a side that, upon energization of any one of or both the first film substrate side and the second film substrate side, fluorescent emission is viewable, a light transparent pattern layer being formed on the fluorescent emission-viewable side.

16. The display according to claim 15, wherein said light transparent pattern layer comprises openings using a light shielding sheet as a substrate.

17. The display according to claim 15, wherein said light transparent pattern layer is a design layer formed by printing.

18. The display according to claim 17, wherein said design layer is formed of a transparent film substrate different from the film substrate constituting the EL element.

19. The display according to claim 15, wherein a barrier layer having at least one of gas barrier properties and water vapor barrier properties is provided on any one of or both a surface of the first film substrate and a surface of the second film substrate which face each other.

* * * * *

UNITED STATES PATENT AND TRADEMARK OFFICE
CERTIFICATE OF CORRECTION

| | |
|---|---|
| PATENT NO. | : 7,733,018 B2 |
| APPLICATION NO. | : 10/527502 |
| DATED | : June 8, 2010 |
| INVENTOR(S) | : Shinichi Handa et al. |

Page 1 of 1

It is certified that error appears in the above-identified patent and that said Letters Patent is hereby corrected as shown below:

Title page, Item (54), Title: *please change* "EL AND DISPLAY DEVICE HAVING SEALANT LAYER" to --EL DISPLAY DEVICE HAVING A SEALANT LAYER--

In the specifications:

In column 1, line 1 Title should read EL DISPLAY DEVICE HAVING A SEALANT LAYER

Signed and Sealed this
Twenty-ninth Day of March, 2011

David J. Kappos
*Director of the United States Patent and Trademark Office*